United States Patent
Prokoflev et al.

(10) Patent No.: US 7,053,466 B2
(45) Date of Patent: May 30, 2006

(54) HIGH-SPEED SIGNALING INTERFACE WITH BROADSIDE DYNAMIC WAVE COUPLING

(75) Inventors: Victor Prokoflev, Phoenix, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 10/321,874

(22) Filed: Dec. 17, 2002

(65) Prior Publication Data

US 2004/0113239 A1 Jun. 17, 2004

(51) Int. Cl.
*H05K 7/02* (2006.01)
*H05K 1/16* (2006.01)

(52) U.S. Cl. .................. 257/662; 257/728; 257/724; 257/725; 257/698; 257/691; 257/207; 257/208; 257/211; 257/194; 257/81; 372/38; 372/50; 372/26; 372/29; 361/782; 361/766; 361/734

(58) Field of Classification Search .............. 257/662, 257/728, 724, 725, 698, 690, 691, 207, 208, 257/211, 194, 81; 372/38, 50, 26, 29; 361/782, 361/766, 734
See application file for complete search history.

(56) References Cited

PUBLICATIONS

Drost, Robert J., et al., "Proximity Communication", *IEEE 2003 Custom Integrated Circuits Conference*, (2003),469–472.

Jackson, Robert.W., et al., "Surface–to–Surface Transition via Electromagnetic Coupling of Coplanar Waveguides", *IEEE Transactions on Microwave Theory and Techniques.* vol. MTT–35, No. 11, (Nov. 1997), 1027–1032.

Kuhn, Stefan.A., et al., "Vertical Signal Transmission in Three–Dimensional Integrated Circuits by Capacitve Coupling", *1995 IEEE*, (1995),37–40.

Osaka, Hideki.,et al. ,"High–Speed, high–bandwidth DRAM memory bus with Crosstalk Transfer Logic (XTL) Interface", *2001 IEEE* (2007),63–67.

Tahara, Yukihiro.,et al. ,"Low–Loss Serial Power Combiner Using Novel Suspended Stripline Couplers", *2001 IEEE MTT–S Digest*, (2001),39–42.

Tefiku, Faton.,et al. ,"Novel Directional Couplers Using Broadside–Coupled Coplanar Waveguides for Double–Sided Printed Antennas", *IEEE Transactions on Microwave Theory and Techniques, vol. 44, No. 2,* (Feb. 1996), 275–282.

*Primary Examiner*—Alexander Oscar Williams
(74) *Attorney, Agent, or Firm*—Schwegman, Lundberg, Woessner & Kluth, P.A.

(57) ABSTRACT

A contact-less high-speed signaling interface and method provide for the communication of high-speed signals across an interface, such as a die-substrate interface or die-die interface. The interface includes a transmission-line structure disposed on a dielectric medium to carry a high-speed forward incident signal, and another transmission-line structure disposed on another dielectric medium and substantially aligned with the other transmission-line structure to generate a coupled high-speed signal in a direction opposite to the incident signal.

11 Claims, 6 Drawing Sheets

HIGH-SPEED SIGNALING INTERFACE WITH BROADSIDE DYNAMIC WAVE COUPLING

TECHNICAL FIELD

The present invention pertains to semiconductor packaging, and in particular to high-speed signaling across an interface, such as a die-substrate interface or a die-die interface.

BACKGROUND

Semiconductor devices, such as a die or chip, are typically coupled with a substrate made from organic-type or ceramic-type material. The substrate may provide power and ground to the semiconductor devices as well as communication paths for I/O data signals. As semiconductor devices operate at continually higher data rates and higher frequencies, high-speed communications are necessary between a die and substrate, or between two dies. Conventional interfaces between a semiconductor device and a substrate and conventional interfaces between two semiconductor devices, typically utilize bonding wires, vias, solder bumps, and/or controlled-collapsed-chip-connections (e.g., C4). One problem with these conventional interfaces is that they are typically capacitive or inductive resulting in the inability to effectively communicate high-speed and/or high-frequency signals. For example, bond wires and vias can be inductive. Another problem with these conventional interfaces is that they typically have a narrow bandwidth inhibiting communication of broadband or wideband signals. Because high-speed digital signals may have a broad frequency spectrum, the use of conventional interfaces may be unsuitable for present and future die substrate and die-die data signal communications.

Another problem with conventional die-substrate interfaces is the coefficient of thermal expansion (CTE) mismatch between a die and a substrate. This mismatch may result in excessive mechanical stresses on the semiconductor device and may result in reliability problems. Yet another problem with conventional die-substrate and die-die interfaces is that conventional signaling typically uses the low-frequency portion of the electromagnetic spectrum resulting in high power consumption.

Thus there is a general need for an improved interface for high-speed signaling.

BRIEF DESCRIPTION OF THE DRAWINGS

The appended claims are directed to some of the various embodiments of the present invention. However, the detailed description presents a more complete understanding of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents.

Figure 1:
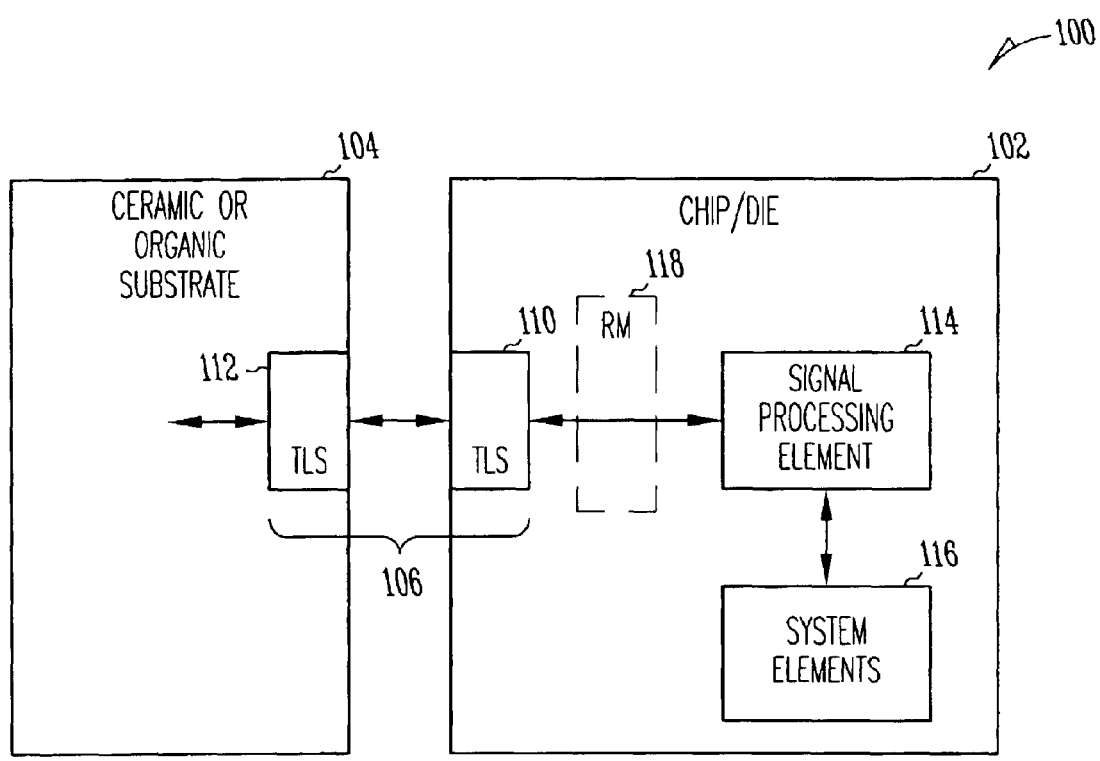
FIG. 1 is a block diagram of a system utilizing a contact-less high-speed signaling interface in accordance with an embodiment of the present invention.

FIG. 1 is a block diagram of a system utilizing a contact-less high-speed signaling interface in accordance with an embodiment of the present invention. System 100 may be part of any processing or computing system, or other electronic device, which utilizes high-speed signaling between components. For example, die 102 may communicate high-speed digital signals with substrate 104 over interface 106. Die 102 may be a semiconductor chip or die, and may be comprised of, for example, Silicon, Germanium, Silicon Germanium, Silicon Carbide, Gallium Arsenide, Gallium Nitride, Indium Arsenide, Indium Phosphide, Sapphire, Diamond, and combinations thereof. Die 102 may alternatively be an organic or ceramic substrate. Substrate 104 may also be a semiconductor chip or die, or an organic or ceramic substrate. Accordingly, interface 106 may be used for die to die as well as die to substrate communications.

Signaling interface 106 may be a contact-less high-speed signaling interface and may comprise transmission-line structure (TLS) 110 disposed on die 102 and transmission-line structure (TLS) 112 on substrate 104. For signals sent from die 102 to substrate 104, transmission-line structure 110 may propagate a high-speed forward incident signal in a forward direction, while transmission-line structure 112 may generate a coupled high-speed signal in a reverse direction to the high-speed forward incident signal. For signals sent from substrate 104 to die 102, transmission-line structure 112 may propagate a high-speed forward incident signal in a forward direction, while transmission-line structure 110 may generate a coupled high-speed signal in a reverse direction to the high-speed forward incident signal. Transmission-line structures 110 and 112 may be substantially aligned with each other to efficiently generate the coupled signal. Embodiments of signaling interface 106 are described in more detail below.

Accordingly, high-speed digital communication may be achieved over a contactless interface, which may be between two dies, or a die and a substrate. This may be particularly beneficial when the die and substrate have significantly different coefficients of thermal expansion (CTE) as in the case of a semiconductor die or chip and an organic substrate. It should be noted that the illustration of system 100, including interface 106, is a functional illustration and may not be representative of an actual physical implementation.

In one embodiment, die 102 may include signal processing element 114 which may process the coupled signal received from interface 106 to generate substantially the original digital signal provided to interface 106 from substrate 104. For example, element 114 may perform an integration on the signal to compensate at least for some of the differentiating effects on the signal resulting from the coupling. The processed signal may be provided to system elements 116. Substrate 104 may also include a signal-processing element (not illustrated), which may process the coupled signal received from interface 106. System elements 116 may include any system element not illustrated including processors, memory I/O, etc.

In one embodiment, die 102 may also include radio module (RM) 118 which may modulate a data signal on a high frequency carrier for transmission across interface 106. The carrier frequency may be within the coupling bandwidth of the interface. In this embodiment, radio module 118 may also be used to demodulate a modulated data signal received across interface 106 from substrate 104.

Although system 100 is illustrated as having several separate functional elements, one or more of the functional elements may be combined and may be implemented by combinations of software configured elements, such as processors including digital signal processors (DSPs), and/or other hardware elements. Although a single interface 106 is illustrated, in other embodiments of the present invention, additional interfaces may provide additional communication paths between die 102 and substrate 104.

Embodiments of the present invention include an improved interface and method for high-speed signaling. In some embodiments, the interface and method may not necessarily require electrical contact between a die and substrate, or a die and another die. In some embodiments, the interface and method may be suitable for high-speed communications between a die and a substrate, or a die and another die. In some embodiments, the interface and method does not necessarily require matched CTEs between a die and substrate. In some embodiments, the interface and method may provide broadband communications between a die and a substrate, or a die and another die. In some embodiments, the method and interface may reduce power consumption by avoiding low-frequency portions of the electromagnetic spectrum. In some embodiments, the interface and method provide a good impedance match for high-speed signals.

Figure 2:
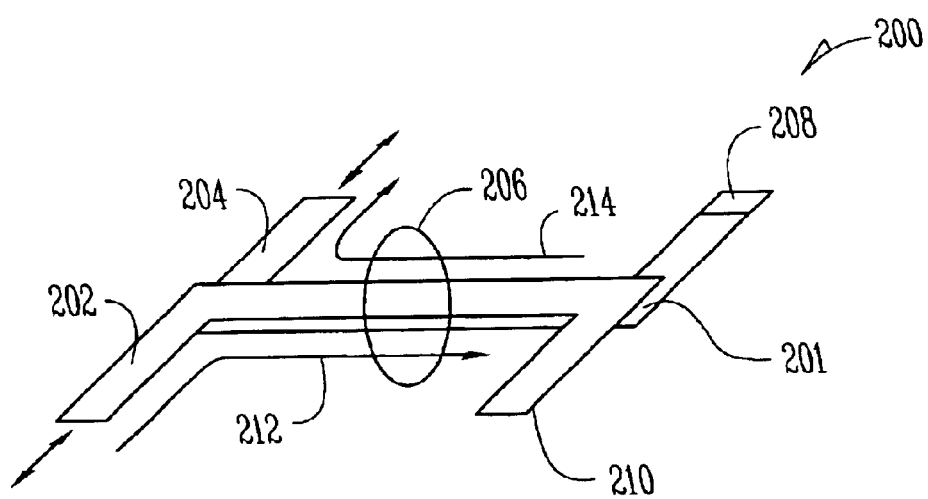
FIG. 2 illustrates a broadside-coupled contact-less high-speed signaling interface in accordance with an embodiment of the present invention.

FIG. 2 illustrates a broadside-coupled contact-less high-speed signaling interface in accordance with an embodiment of the present invention. Signaling interface 200 may be suitable for use as signaling interface 106 (FIG. 1). Signaling interface 200 is comprised of transmission-line structure 202 which may be located on a die or a substrate (e.g., die 102 (FIG. 1)), and transmission-line structure 204 which may be located on another die or another substrate (e.g., substrate 104 (FIG. 1)). In this broadside-coupled embodiment, transmission-line structure 202 may be a planar transmission-line structure comprised of conductive elements residing in a first plane, and transmission-line structure 104 may be a planar transmission-line structure comprised of conductive elements residing in a second plane. The second plane may be substantially parallel to the first plane so that coupling region 206 of the transmission-line structures are in an above and below orientation, (e.g., on top of each other) to provide broadside coupling. In the illustration, transmission-line structure 202 may reside in the plane of the paper, while transmission-line structure 204 may reside in a plane either above or below the paper. In one embodiment, gap 201 may be provided between the transmission-line structures in the coupling regions. The gap may be comprised of air, vacuum or a dielectric, for example. Examples of broadside-coupled interfaces are described in more detail below.

As illustrated, transmission-line structure 202 may propagate/carry a high-speed forward incident signal in direction 212 and transmission-line structure 204 may generate a coupled signal in reverse direction 214. Transmission-line structure 202 may have termination 210 at an end of transmission-line structure 202 to terminate the high-speed forward incident signal. Termination 210 may be a broadband resistive termination (e.g., an integrated resistive film) to substantially reduce reflections of the high-speed forward incident signal. Transmission-line structure 204 may have termination 208 at an end of transmission-line structure 204. Termination 208 may also be a broadband resistive termination.

In one embodiment, the terminations may be selected for matched operation of the interface to provide a coupling factor of approximately less than −3 dB. This may have advantages in feedback control between cascaded components of a communication channel, and may permit load-independent matching of the interface. In addition, a matched termination may provide an increased immunity of the system to noise and electrostatic discharge (ESD) effects.

In one embodiment, coupling region 206 may have a length being approximately a quarter-wavelength of an arithmetic mean of odd and even mode guided wavelengths at about the center frequency of operation. Therefore, depending on the specific dielectric environment, an operational frequency range of 20 to 60 GHz, for example, may be achieved. This permits broadband operation with a large relative bandwidth. In some embodiments, a signaling technique that uses pulse amplitude modulation (PAM) may be used with an appropriate carrier.

Figure 3:
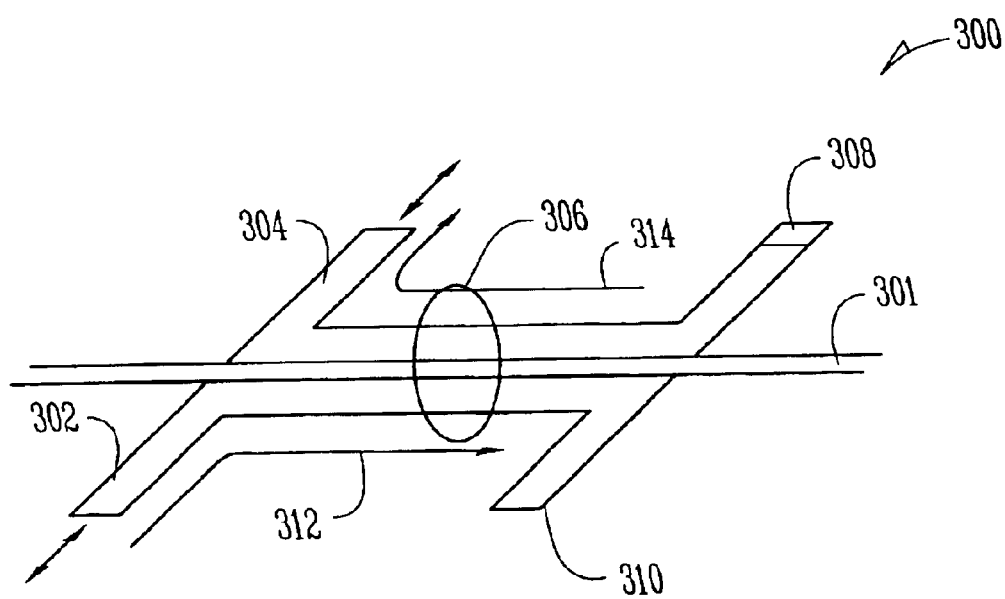
FIG. 3 illustrates an edge-coupled contact-less high-speed signaling interface in accordance with an embodiment of the present invention.

FIG. 3 illustrates an edge-coupled contact-less high-speed signaling interface in accordance with an embodiment of the present invention. Signaling interface 300 may be suitable for use as signaling interface 106 (FIG. 1). Signaling interface 300 is comprised of transmission-line structure 302 which may be located on a die or a substrate (e.g., die 102 (FIG. 1)), and transmission-line structure 304 which may be located on another die or another substrate (e.g., substrate 104 (FIG. 1)). In this edge-coupled embodiment, transmission-line structure 302 may be a planar transmission-line structure comprised of planar elements residing in parallel planes, and transmission-line structure 304 may be a planar waveguide comprised of corresponding planar elements also residing in corresponding planes. Corresponding planar elements of transmission-line structures 302 and 304 may be substantially aligned to provide edge coupling in coupling region 306. In this embodiment, each transmission-line structure 302 and 304 may have planar elements residing in parallel planes.

For example, transmission-line structure 302 may have planar elements residing in both the plane of the paper and one or more planes either above and/or below the paper. Transmission-line structure 304 may have corresponding planar elements residing in both the plane of the paper and one or more planes either above and/or below the paper. In one embodiment, gap 301 may be provided between the transmission-line structures in the coupling regions. The gap may be comprised of air, vacuum or a dielectric, for example. Examples of broadside-coupled interfaces are described in more detail below. As illustrated, transmission-line structure 302 may propagate/carry a high-speed forward incident signal in direction 312 and transmission-line structure 304 may generate a coupled signal in reverse direction 314. Transmission-line structure 302 may have termination 310 at an end of transmission-line structure 302 to terminate the high-speed forward incident signal. Termination 310 may be a broadband resistive termination to substantially reduce reflections of the high-speed forward incident signal. Transmission-line structure 304 may have termination 308 at an end of transmission-line structure 304. Termination 308 may also be a broadband resistive termination.

In embodiments, the transmission-line structures may have a narrower width in the coupling regions (e.g., regions 206, 306) and may have a wider width outside the coupling regions. The coupling regions of the transmission-line structures may be in almost any shape, and in some embodiments, may be in a spiral shape, an "S" shape, a straight line (as illustrated) or a curved line. In embodiments, interfaces 200 and 300 may operate similar to a microwave directional coupler.

Figure 4:
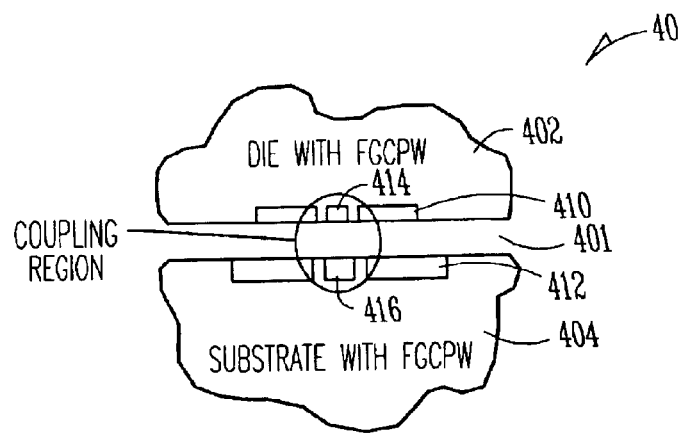
FIG. 4 illustrates a cross-section of a coupling region of a broadside-coupled contact-less high-speed signaling interface in accordance with an embodiment of the present invention.

FIG. 4 illustrates a cross-section of a coupling region of a broadside-coupled contact-less high-speed signaling interface in accordance with an embodiment of the present invention. Cross-section 400 illustrates one example of a cross-section that may correspond with a cross section of coupling region 206 of interface 200 (FIG. 2). In this embodiment, transmission-line structures 410 and 412 are coplanar waveguides residing in separate parallel planes. In this embodiment, die 402 may correspond with die 102 (FIG. 1), and transmission-line structure 410 may correspond with transmission-line structure 110 (FIG. 1) and transmission-line structure 202 (FIG. 2), while substrate 404 may correspond with substrate 104 (FIG. 1), and transmission-line structure 412 may correspond with transmission-line structure 112 (FIG. 1) and transmission-line structure 204 (FIG. 2). In one embodiment, transmission-line structures 410 and 412 may comprise finite ground coplanar waveguides (FGCPW). Center conductors 414, 416 may be substantially aligned in the coupling region to provide broadside coupling. Nothing requires that the conductors of transmission-line structure 410 be the same size as conductors of transmission-line structure 412. Furthermore, the impedance of transmission-line structures 410 and 412 may be different. Gap 401 may be provided between die 402 and substrate 404 in the coupling region.

Figure 5:
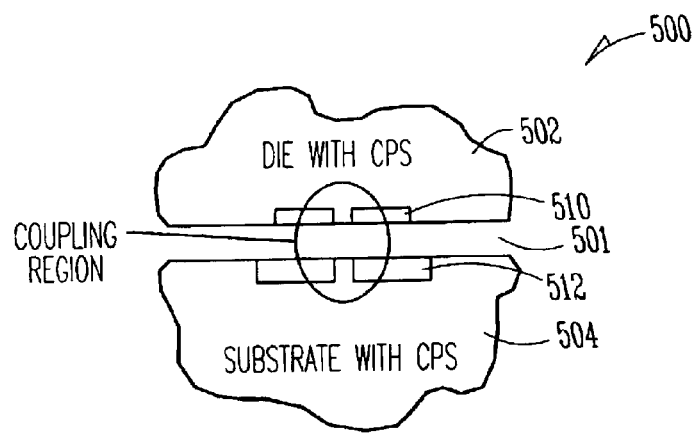
FIG. 5 illustrates a cross-section of a coupling region of a broadside-coupled contact-less high-speed signaling interface in accordance with another embodiment of the present invention.

FIG. 5 illustrates a cross-section of a coupling region of a broadside-coupled contact-less high-speed signaling interface in accordance with another embodiment of the present invention. Cross-section 500 illustrates another example of a cross-section that may correspond with a cross section of coupling region 206 of interface 200 (FIG. 2). In this embodiment, transmission-line structures 510 and 512 are comprised of coplanar strips residing in separate parallel planes. In this embodiment, die 502 may correspond with die 102 (FIG. 1), and transmission-line structure 510 may correspond with transmission-line structure 110 (FIG. 1) and transmission-line structure 202 (FIG. 2), while substrate 504 may correspond with substrate 104 (FIG. 1), and transmission-line structure 512 may correspond with transmission-line structure 112 (FIG. 1) and transmission-line structure 204 (FIG. 2). In this embodiment, transmission-line structures 510 and 512 may comprise a pair of differential signaling lines residing in parallel planes. In yet another embodiment, transmission-line structures 510 and 512 may also comprise a single-ended transmission line residing in parallel planes with one of the strips serving as a reference conductor. It should be noted that nothing requires that the conductors of transmission-line structure 510 be the same size as conductors of transmission-line structure 512. Furthermore, the impedance of transmission-line structures 510 and 512 may be different. Gap 501 may be provided between die 502 and substrate 504 in the coupling region.

Figure 6:
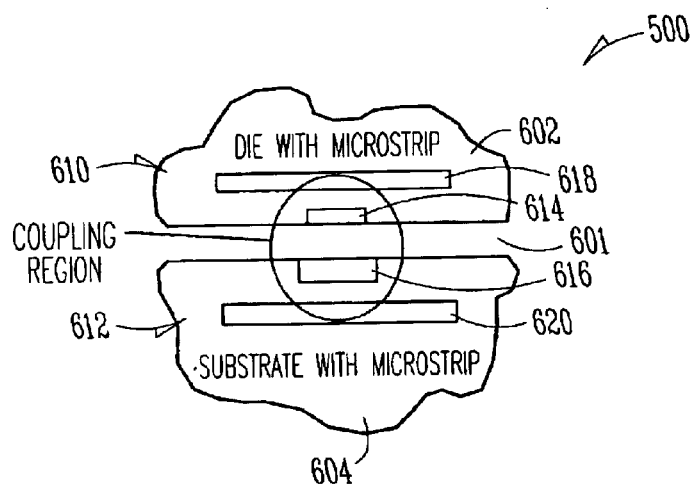
FIG. 6 illustrates a cross-section of a coupling region of a broadside-coupled contact-less high-speed signaling interface in accordance with another embodiment of the present invention.

FIG. 6 illustrates a cross-section of a coupling region of a broadside-coupled contact-less high-speed signaling interface in accordance with another embodiment of the present invention. Cross-section 600 illustrates yet another example of a cross-section that may correspond with a cross section of coupling region 206 of interface 200 (FIG. 2). In this embodiment, transmission-line structures 610 and 612 are microstrip transmission lines having signal tracks 614 and 616 residing in different parallel planes. In this embodiment, the microstrip structures may have reference conductors 618 and 620, which may reside in opposite parallel planes. Reference conductors 618 and 620 may, for example, be ground planes. Signal conductors 614, 616 may be substantially aligned in the coupling region to provide broadside coupling. In this embodiment, die 602 may correspond with die 102 (FIG. 1), and transmission-line structure 610 may correspond with transmission-line structure 110 (FIG. 1) and transmission-line structure 202 (FIG. 2), while substrate 604 may correspond with substrate 104 (FIG. 1), and transmission-line structure 612 may correspond with transmission-line structure 112 (FIG. 1) and transmission-line structure 204 (FIG. 2). Nothing requires that the conductors of transmission-line structure 610 be the same size as conductors of transmission-line structure 612. Furthermore, the impedance of transmission-line structures 610 and 612 may be different. Gap 601 may be provided between die 602 and substrate 604 in the coupling region.

Figure 7:
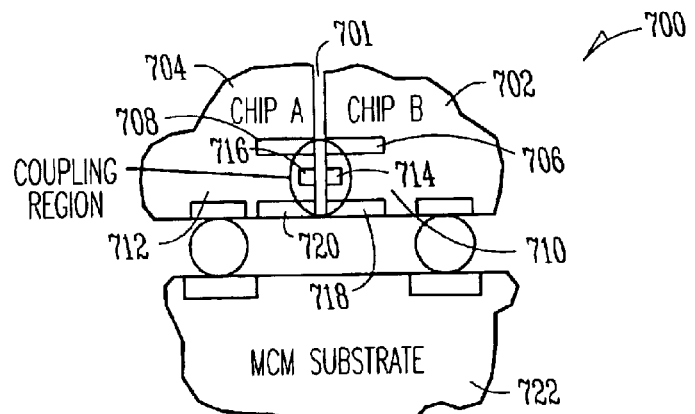
FIG. 7 illustrates a cross-section of a coupling region of an edge-coupled contact-less high-speed signaling interface in accordance with an embodiment of the present invention.

FIG. 7 illustrates a cross-section of a coupling region of an edge-coupled contact-less high-speed signaling interface in accordance with an embodiment of the present invention. Cross-section 700 illustrates one example of a cross-section that may correspond with a cross section of coupling region 306 of interface 300 (FIG. 3). In this embodiment, transmission-line structures 710 and 712 are stripline structures with reference conductors 706 and 708 residing substantially in one plane, reference conductors 718 and 720 residing substantially in another plane, and signal conductors 714 and 716 residing substantially in yet a third plane. In this embodiment, die 702 may correspond with die 102 (FIG. 1), and transmission-line structure 710 may correspond with transmission-line structure 110 (FIG. 1) and transmission-line structure 302 (FIG. 3), while die 704 may correspond with substrate 104 (FIG. 1), and transmission-line structure 712 may correspond with transmission-line structure 112 (FIG. 1) and transmission-line structure 304 (FIG. 3). Center conductors 714, 716 may be substantially aligned in the coupling region to provide edge coupling. Nothing requires that the conductors of transmission-line structure 710 be the same size as conductors of transmission-line structure 712. Furthermore, the impedance of transmission-line structures 710 and 712 may be different. Gap 701 may be provided between die 702 and die 704 in the coupling region.

In this embodiment, die 702 and die 704 may be coupled to substrate 722 by a conventional attachment technique, such as by solder or bond wires. In one embodiment, substrate 722 may be a substrate for a multichip module.

Figure 8:
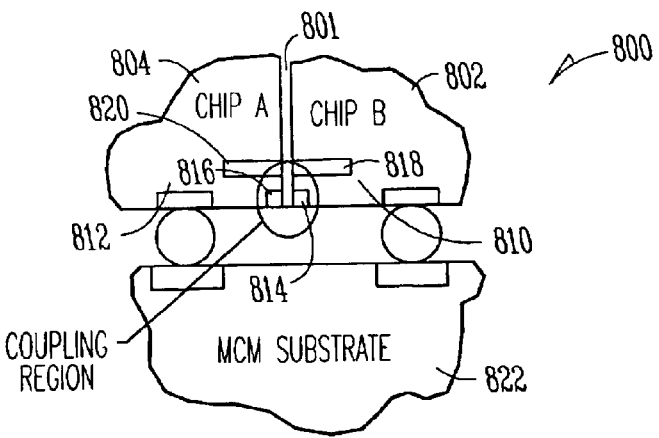
FIG. 8 illustrates a cross-section of a coupling region of an edge-coupled contact-less high-speed signaling interface in accordance with another embodiment of the present invention.

FIG. 8 illustrates a cross-section of a coupling region of an edge-coupled contact-less high-speed signaling interface in accordance with an embodiment of the present invention. Cross-section 800 illustrates one example of a cross-section that may correspond with a cross section of coupling region 306 of interface 300 (FIG. 3). In this embodiment, transmission-line structures 810 and 812 are microstrip structures with reference conductors 818 and 820 residing substantially in one plane, and signal conductors 814 and 816 residing substantially in another plane. In this embodiment, die 802 may correspond with die 102 (FIG. 1), and transmission-line structure 810 may correspond with transmission-line structure 110 (FIG. 1) and transmission-line structure 302 (FIG. 3), while die 804 may correspond with substrate 104 (FIG. 1), and transmission-line structure 812 may correspond with transmission-line structure 112 (FIG. 1) and transmission-line structure 304 (FIG. 3). Signal conductors 814, 816 may be substantially aligned in the coupling region to provide edge-side coupling. Nothing requires that the conductors of transmission-line structure 810 be the same size as conductors of transmission-line structure 812. Furthermore, the impedance of transmission-line structures 810 and 812 may be different. Gap 801 may be provided between die 802 and die 804 in the coupling region.

In this embodiment, die 802 and die 804 may be coupled to substrate 822 by a conventional attachment technique, such as by solder or bond wires. In one embodiment, substrate 822 may be a substrate for a multichip module.

Figure 9:
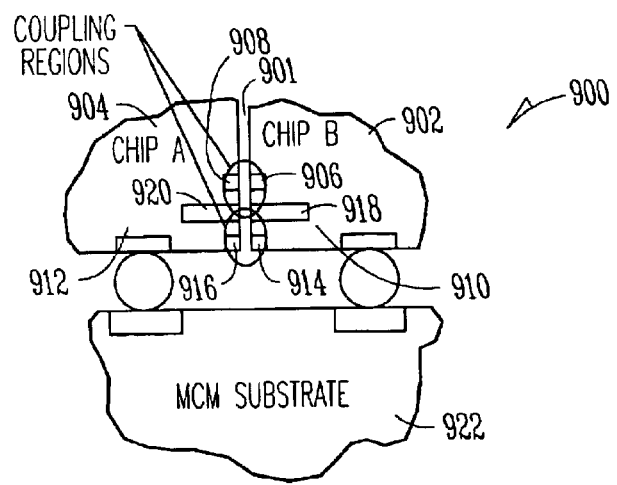
FIG. 9 illustrates a cross-section of a coupling region of an edge-coupled contact-less high-speed signaling interface in accordance with another embodiment of the present invention.

FIG. 9 illustrates a cross-section of a coupling region of an edge-coupled contact-less high-speed signaling interface in accordance with an embodiment of the present invention. Cross-section 900 illustrates one example of a cross-section that may correspond with a cross section of coupling region 306 of interface 300 (FIG. 3). In this embodiment, transmission-line structures 910 and 912 are stacked microstrip structures with reference conductors 918 and 920 residing substantially in one plane, signal conductors 914 and 916 residing substantially another plane, and signal conductors 906 and 908 residing substantially in yet a third plane. In this embodiment, die 902 may correspond with die 102 (FIG. 1), and transmission-line structure 910 may correspond with transmission-line structure 110 (FIG. 1) and transmission-line structure 302 (FIG. 3), while die 904 may correspond with substrate 104 (FIG. 1), and transmission-line structure 912 may correspond with transmission-line structure 112 (FIG. 1) and transmission-line structure 304 (FIG. 3). Corresponding signal conductors 914, 916 may be substantially aligned in the coupling region to provide edge coupling. Corresponding signal conductors 906 and 908 may also be substantially aligned in the coupling region to provide edge coupling. Nothing requires that the conductors of transmission-line structure 910 be the same size as conductors of transmission-line structure 912. Furthermore, the impedance of transmission-line structures 910 and 912 may be different. Gap 901 may be provided between die 902 and die 904 in the coupling region.

In this embodiment, die 902 and die 904 may be coupled to substrate 922 by a conventional attachment technique, such as by solder or bond wires. In one embodiment, substrate 922 may be a substrate for a multichip module.

Figure 10:
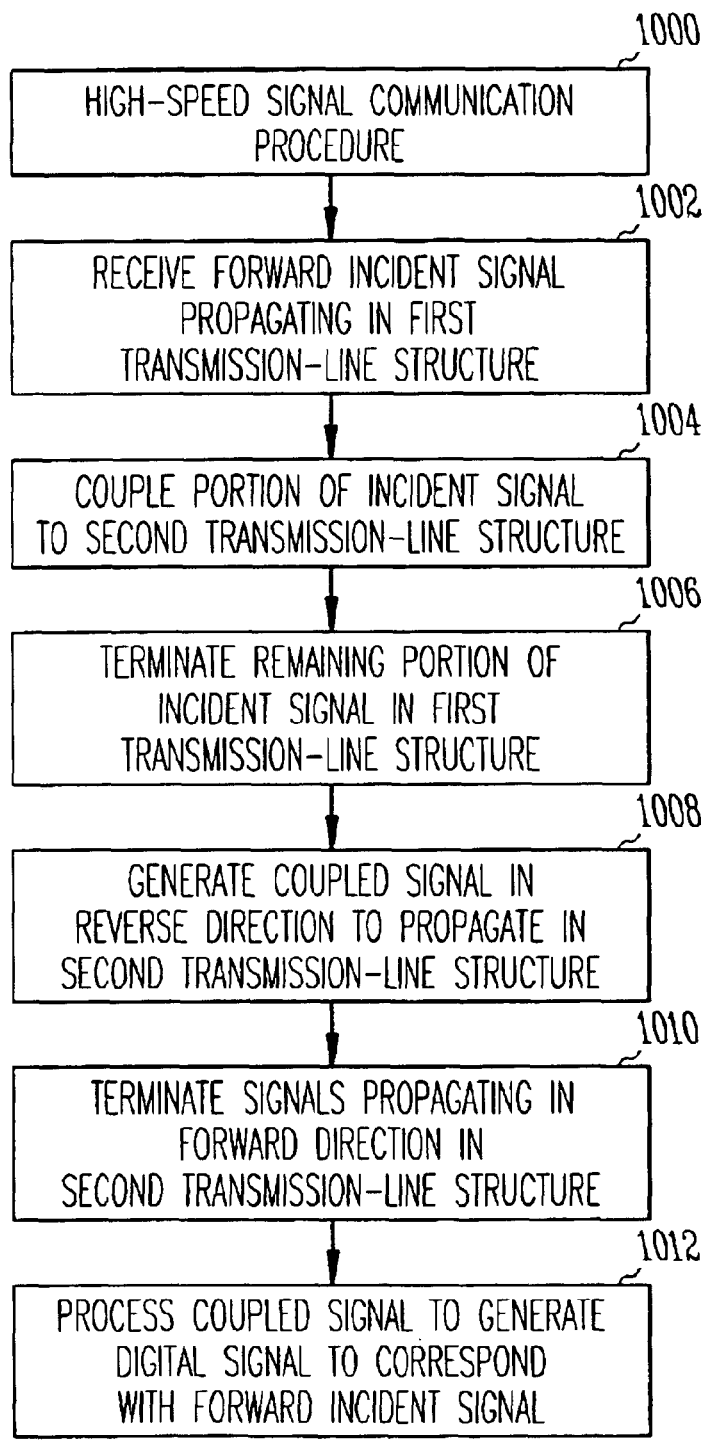
FIG. 10 is a flow chart of a high-speed signal communication procedure in accordance with an embodiment of the present invention.

FIG. 10 is a flow chart of a high-speed signal communication procedure in accordance with an embodiment of the present invention. Procedure 1000 may be performed by some elements of system 100 (FIG. 1) although other elements may also be used to perform procedure 1000. Procedure 1000 may be used to communicate high-speed signals across a contact-less interface between a die and a substrate. In operation 1002, a high-speed forward incident signal may be received in a first transmission-line structure. The incident signal may be in a forward direction. In operation 1004, the incident signal may be coupled to a second transmission-line structure. The first and second transmission-line structures may be disposed on separate dielectric mediums. In operation 1006, the high-speed forward incident signal may be terminated in a first termination coupled to the first transmission-line structure. In operation 1008, a coupled signal is generated in a reverse direction to the incident signal in the second transmission-line structure. In operation 1010, coupled signals in the forward direction are terminated in a second termination coupled to the second transmission-line structure.

In one embodiment, operation 1012 may be performed. In this embodiment, the high-speed forward incident signal may be a digital signal, and operation 1012 may include integrating the coupled high-speed signal to generate a digital signal substantially corresponding with the high-speed forward incident signal.

Although the individual operations of procedure 1000 are illustrated and described as separate operations, one or more of the individual operations may be performed concurrently and nothing requires that the operations be performed in the order illustrated.

Figure 11:
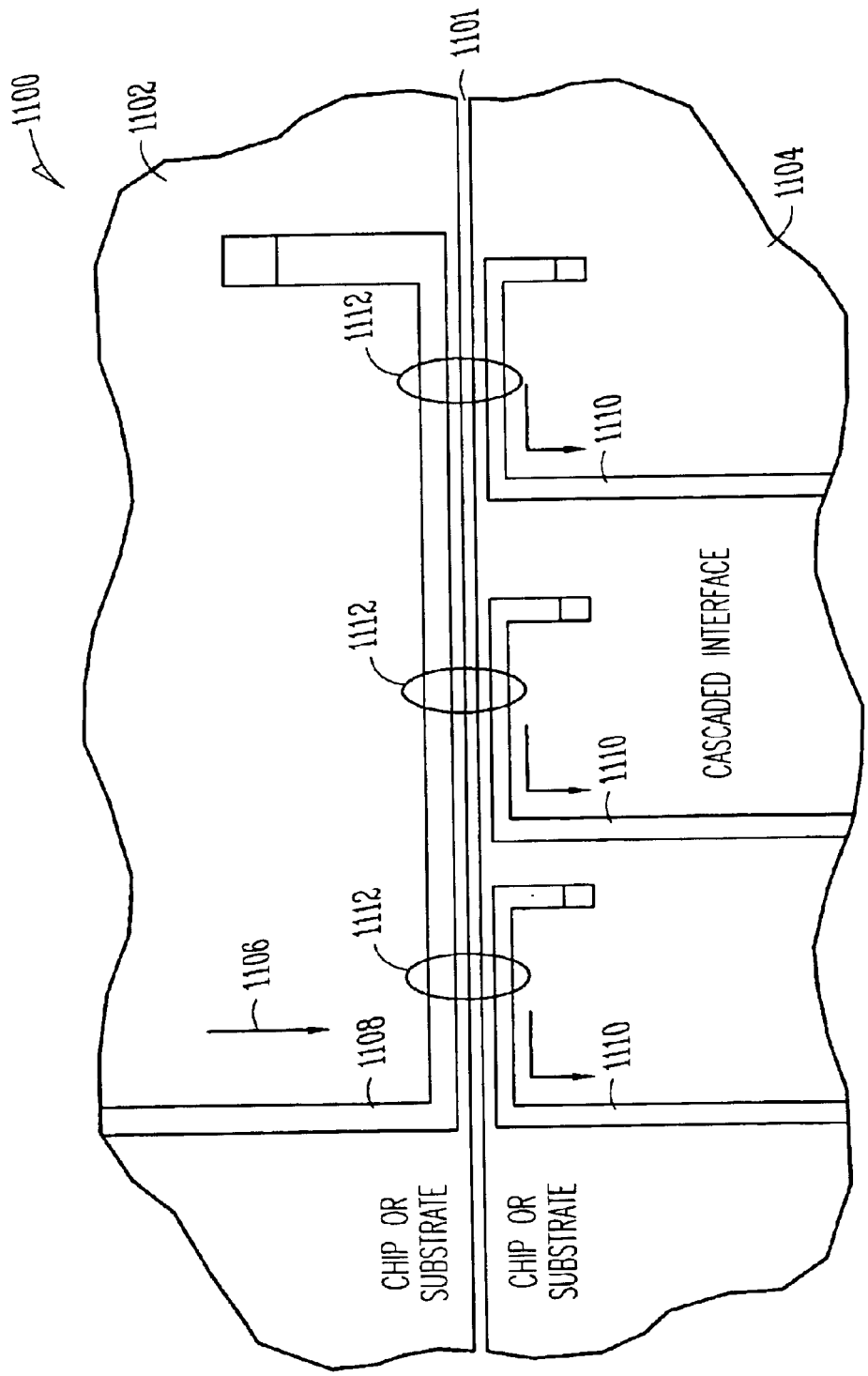
FIG. 11 illustrates a cascaded interface in accordance with an embodiment of the present invention.

FIG. 11 illustrates a cascaded interface in accordance with an embodiment of the present invention. Cascaded interface 1100 may be used in system 100 (FIG. 1) in place of interface 106 to provide signaling between substrate 1102 and a plurality of elements on die 1104, or vice-versa. Cascaded interface 1100 provides for the coupling of forward incident signal 1106 propagating on transmission-line structure 1108 to each of a plurality of transmission-line structures 1110. Interfaces 112 between the transmission-line structures may be either broadside coupled interfaces such as those described in FIGS. 2, 4, 5 and 6, or edge coupled interfaces such as those described in FIGS. 3, 7, 8 and 9.

Thus, an improved interface for high-speed signaling that does not require electrical contact between a die and substrate, or between a die and another die, has been described. The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and scope of the appended claims.

What is claimed is:

1. A high-speed signaling interface comprising:
   a first transmission-line structure disposed on a surface of a first dielectric medium to carry a high-speed forward incident electromagnetic wave; and
   a second transmission-line structure disposed on a surface of a second dielectric medium and substantially aligned with the first transmission-line structure to generate a coupled high-speed electromagnetic wave in a reverse direction to the incident electromagnetic wave,
   wherein the high-speed forward incident electromagnetic wave is to be dynamically wave coupled from the first transmission line structure to the second transmission line structure in a coupling region of the transmission line structures.

2. The interface of claim 1 wherein the first transmission-line structure is a first planar transmission-line structure comprised of conductive elements residing in a first plane, and the second transmission-line structure is a second planar waveguide comprised of conductive elements residing in a second plane, the second plane being substantially parallel to the first plane, wherein the first and second transmission-line structures are substantially aligned to provide broadside dynamic wave coupling therebetween to generate the high-speed coupled wave.

3. The interface of claim 2 wherein the first and second transmission-line structures comprise co-planar strips residing respectively within the first and second planes.

4. The interface of claim 2 wherein the first and second transmission-line structures each comprise a pair of differential lines residing respectively within the first and second planes.

5. The interface of claim 3 further comprising:
   a first broadband termination at an end of the first transmission-line structure to terminate the high-speed forward incident wave, the first broadband termination being a resistive termination to substantially reduce reflections of the high-speed forward incident wave; and
   a second broadband termination at a corresponding end of the second transmission-line structure, the second broadband termination being a resistive termination.

6. The interface of claim 5 wherein the first and second transmission-line structures are substantially aligned in the coupling region, the coupling region not including the terminations, the coupling region having a length being approximately a quarter-wavelength of frequency of operation.

7. The interface of claim 6 wherein the first and second transmission-line structures have a narrower width in the coupling region and wider width outside the coupling region, and
   wherein the length of the coupling region is approximately a quarter-wavelength of an arithmetic mean of odd and even mode guided wavelengths of the incident electromagnetic wave at approximately a center frequency of operation.

8. The interface of claim 6 wherein the transmission line structures in the coupling region are one of either a spiral shape, an "S" shape, a straight line, or a curved line.

9. The interface of claim 3 wherein the first transmission-line structure and first broadband termination are disposed on a die, and the second transmission-line structure and second broadband termination are disposed on a substrate, the die and substrate having significantly different coefficients of thermal expansion (CTE), the substrate being comprised of either a ceramic or an organic material.

10. The interface of claim 3 wherein the high-speed forward incident wave is a digital signal, and wherein the coupled high-speed wave is to be integrated to compensate at least in part for differentiation effects of the interface to generate a digital signal corresponding with the high-speed forward incident wave.

11. The interface of claim 3 wherein the high-speed forward incident wave comprises a carrier frequency modulated with a data signal, the carrier frequency being within a coupling bandwidth of the interface.

* * * * *

UNITED STATES PATENT AND TRADEMARK OFFICE
CERTIFICATE OF CORRECTION

| | | |
|---|---|---|
| PATENT NO. | : 7,053,466 B2 | Page 1 of 1 |
| APPLICATION NO. | : 10/321874 | |
| DATED | : May 30, 2006 | |
| INVENTOR(S) | : Prokofiev et al. | |

It is certified that error appears in the above-identified patent and that said Letters Patent is hereby corrected as shown below:

On Title Page Item 75, in "Inventors", in column 1, line 1, delete "Prokoflev," and insert -- Prokofiev, --, therefor.

On Title Page Item 56, in column 1, below "References Cited" insert
--         U.S. PATENT DOCUMENTS
      5,629,838 *      5/1997     Knight et al.   361/782
      5,848,084 *     12/1998    Rokugawa    372/38.04
      6,130,483 *     10/2000    Shizuki et al.  257/778
      2002/0186106 Al * 12/2002   Miller       333/247
      2003/0122153 Al * 7/2003    Suzuki et al.   257/194
      2003/0183919 Al* 10/2003   Devnani et al. 257/691--.

On Title Page Item 56, under "Publications", in column 2, line 3, delete "Techniques." and insert -- Techniques, --, therefor.

On Title Page Item 56, under "Publications", in column 2, line 6, delete "Capacitve" and insert -- Capacitive --, therefor.

On Title Page Item 56, under "Publications", in column 2, line 11, delete "Low-Loss" and insert -- A Low-Loss --, therefor.

Signed and Sealed this

Fourteenth Day of November, 2006

JON W. DUDAS
*Director of the United States Patent and Trademark Office*